United States Patent [19]

Wiegand

[11] 4,219,861
[45] Aug. 26, 1980

[54] PROTECTOR CIRCUIT FOR SOLENOID OPERATOR

[75] Inventor: Henry Wiegand, Philadelphia, Pa.
[73] Assignee: Gould Inc., Rolling Meadows, Ill.
[21] Appl. No.: 963,754
[22] Filed: Nov. 27, 1978
[51] Int. Cl.² ............................................ H01H 51/12
[52] U.S. Cl. .................................... 361/106; 335/156; 361/165
[58] Field of Search ...................... 361/106, 165, 205; 335/156

[56] References Cited

U.S. PATENT DOCUMENTS

| | | | |
|---|---|---|---|
| 3,500,074 | 3/1970 | Obenhaus | 361/165 X |
| 3,781,839 | 12/1973 | Bodge | 361/106 X |
| 4,019,097 | 4/1977 | Miller et al. | 361/106 X |
| 4,071,836 | 1/1978 | Cook et al. | 335/16 |

Primary Examiner—J. D. Miller
Assistant Examiner—L. C. Schroeder
Attorney, Agent, or Firm—Ostrolenk Faber Gerb & Soffen

[57] ABSTRACT

A protector means is provided to prevent thermal destruction of a solenoid adapted for very short duration energization at currents far in excess of the continuous current carrying capability of the solenoid. The protector means includes a positive temperature coefficient thermistor which controls the gate potential of an S.C.R. whose power circuit is in series with the solenoid. When thermistor temperature rises to a predetermined level the voltage applied to the gate drops below the gate threshold thereby preventing the S.C.R. from firing on the next positive half-cycle.

12 Claims, 6 Drawing Figures

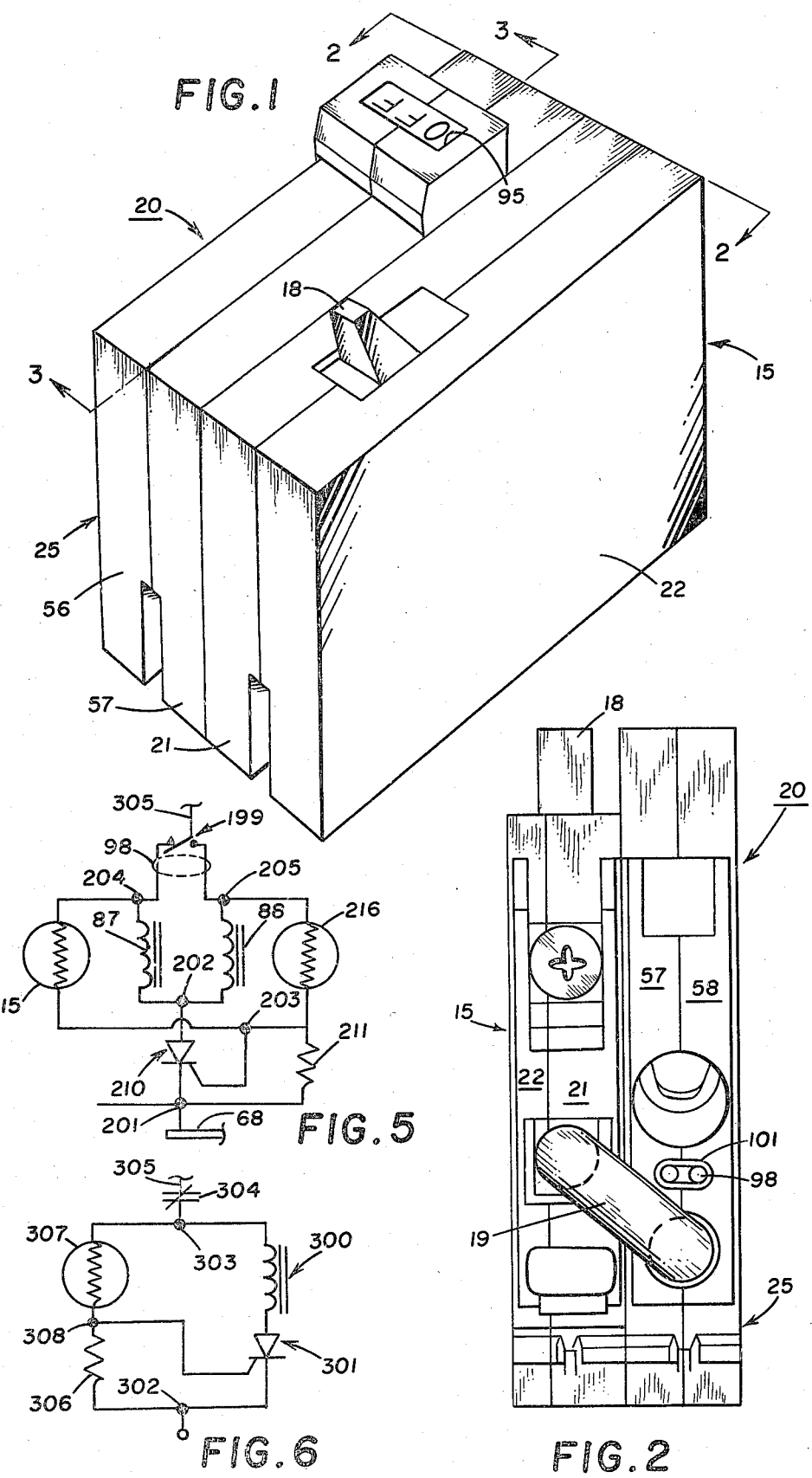

PROTECTOR CIRCUIT FOR SOLENOID OPERATOR

This invention relates to electrical switching devices in general and more particularly relates to means for protecting a solenoid operator against thermal destruction.

The copending U.S. application Ser. No. 893,209 filed Apr. 3, 1978 by G. Gaskill and J. Horn for Load Management Apparatus describes a load management module in which a pair of solenoids are alternately operated to actuate an overcenter spring powered toggle mechanism to open and close switch contacts. The solenoids are very compact and are operated momentarily at currents far in excess of the continuous current ratings of these solenoids. Under this type of operation the danger of solenoid destruction is very great, especially since destruction will take place should solenoid energization continue for only a very short time in excess of that energization time required to achieve switching.

In the prior art, to protect the switching solenoids against destruction mechanical switches are wired into the solenoid energizing circuits, with the switches being operated as a function of solenoid position. Because of limited available space these switches are very compact and they are designed to operate with little mechanical effort. Should one of these switches malfunction, a pumping action will take place, there will be arcing at the switch contacts, or there will be prolonged excitation of the solenoid resulting in its thermal destruction.

In order to overcome the aforesaid difficulties of the prior art, the instant invention provides a solid state protector means which operates as a function of temperature to interrupt energization of the solenoids before thermal destruction thereof. In particular, the protector means of the instant invention provides a voltage divider including a positive temperature coefficient thermistor. The solenoid is connected in series with the power ciruit of an S.C.R. whose control electrode is connected to the voltage divider. When the positive temperature coefficient thermistor is cool and for a permissible heating range thereof, the S.C.R. will fire and permit current flow through the solenoid. At a predetermined temperature, the thermistor in question exhibits a switch like increase in resistance thereby causing the potential applied to the switching electrode of the S.C.R. to fall below the S.C.R. gate threshold to prevent the S.C.R. from conducting. This action, hence the deenergization of the solenoid, takes place very rapidly to prevent thermal destruction of the solenoid.

Accordingly, a primary object of the instant invention is to provide novel means for protecting a solenoid against thermal destruction.

Another object is to provide a protector means of this type which utilizes a thermistor to control the operation of a controllably conductive semiconductor device.

Still another object is to provide protector means of this type which utilizes a positive temperature coefficient thermistor for controlling the blocking of an S.C.R.

A further object is to provide a protector means of this type which utilizes relatively few components, none of which must be chosen with critical tolerances in mind.

These objects as well as other objects of this invention shall become readily apparent after reading the following description of the accompanying drawings in which:

FIG. 1 is a perspective of a load management unit including a protector means constucted in accordance with teachings of the instant invention.

FIG. 2 is an end view looking in the direction of arrows 2—2 of FIG. 1.

FIG. 5 is an electrical schematic of the protector means.

FIG. 6 is an electrical schematic illustrating another embodiment of the protector means.

Figure 4:
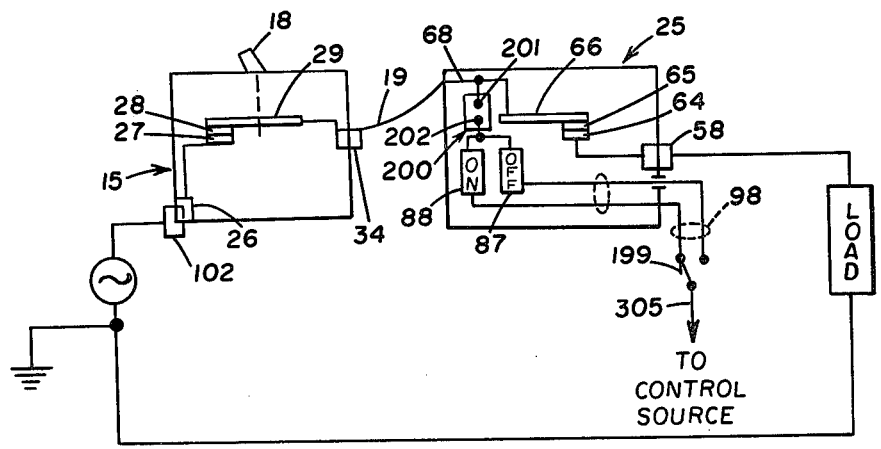
FIG. 4 is an electrical schematic of the apparatus of FIG. 1, excluding details of the protector means.

Load management apparatus 20 consists of manually operable switching module 15 connected in electrical series with remotely operable management module by single conductor 19. Modules 15 and 25 are of essentially the same width, are stacked side-by-side and have profiles (side elevations) with similar though not necessarily identical outlines. Switching module 15 is a conventional single pole molded case circuit breaker provided with fault current responsive automatic trip means (not shown). Module 15 includes a narrow housing consisting of base 21 and cover 22 which cooperate to enclose the mechanism for operating co-operating contacts 27, 28 (FIG. 4) automatically as well as by manual operating handle 18. Housing 21, 22 also encloses the current carrying elements extending from line terminal member 26 to wire grip 34. These current carrying elements include contacts 27, 28 and movable contact arm 29.

Figure 3:
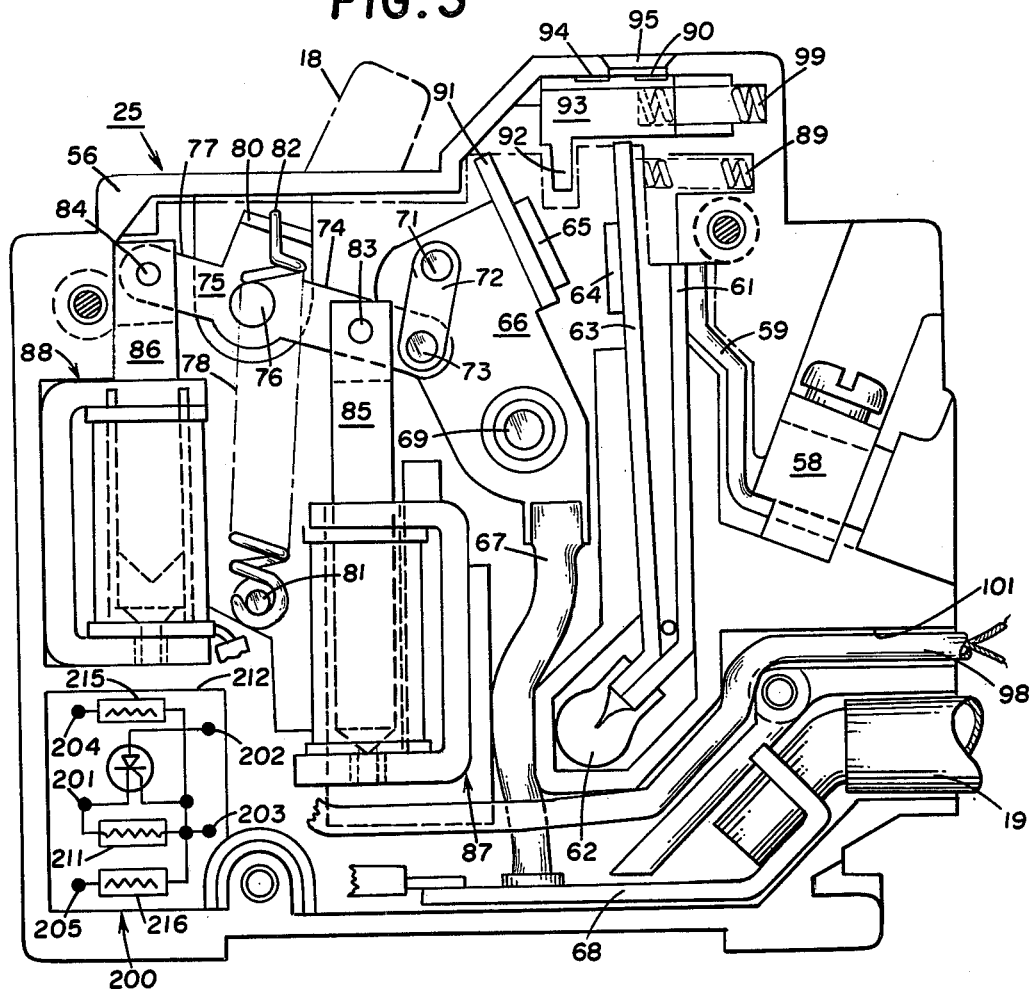
FIG. 3 is a cross-section of the load management module taken through line 3—3 of FIG. 1 looking in the direction of arrows 3—3.

Load management module 25 includes a molded insulating housing consisting of base 56 and cover 57. As seen in FIG. 3, the main current path through module 25 consists of wire grip 58, terminal strap 59, stiff elongated conductor 61, short flexible braid 62, elongated stiff conductor 63, relatively stationary contact 64, movable contact 65, movable contact arm 66, flexible braid 67 and terminal strap 68 having jumper 19 connected thereto.

Movable contact arm 66 is pivotally mounted on fixed ring embossment 69 and is pivotally connected by pin 71 to one end of toggle link 72 pivotally connected at its other end by its pin 73 to another toggle link provided by arm 74 of rocker member 75. The latter is mounted on fixed pivot 76 which is disposed at the connecting point between oppositely extending arm 74, 77 of member 75. Main operating spring 78 is a coiled tension member whose rear end 79 is connected to fixed support 81 on base 56 and whose front end 82 is connected to offset portion 80 of rocker 75 disposed forward of pivot 76.

Pins 83, 84 connect the upper ends of the respective plunger pins or armatures 85, 86 of solenoids 87, 88, respectively, to rocker 75 at the respective arms 74, 77 thereof. When main contacts 64, 65 are open, the line of action for spring 78 extends to the right of rocker pivot 76 so that member 75 is biased clockwise by spring 78 and toggle 72, 74 is collapsed. When solenoid 88 is energized momentarily, armature 86 thereof is driven rearwardly thereby pivoting rocker 75 counterclockwise. After short counterclockwise motion of rocker 75 the upper end 82 of spring 78 moves to the left of pivot 76 so that the line of action for spring 78 also moves to the left of pivot 76 and the spring energy pivots rocker 75 counterclockwise from the position shown in FIG. 3. In this counterclockwise position of rocker 75, toggle 72, 74 is extended and movable main contact 65 engages relatively stationary main contact 64. As contacts 64, 65 engage, contact 64 is moved slightly to the right of its position in FIG. 3 thereby compressing coiled contact pressure spring 89 which bears against the forward end of conductor 63.

In addition, as movable contact arm 66 moves toward the closed circuit position, forward extension 91 thereof engages tail 92 of indicator member 93 moving the latter to the right with respect to FIG. 3 to a position wherein On indication 94 is aligned with window 95 in the front surface of housing 56, 57. With movable contact arm 66 in the open circuit position of FIG. 3, coiled compression spring 99 urges indicator 93 to a non-indicating position wherein Off indicia 90 is no longer aligned with window 95. The operation of movable contact arm 66 to the Off position is obtained by momentarily energizing solenoid 87 thereby drawing armature 85 thereof rearward and rocking member 75 clockwise until the line of action of spring 78 moves to the right of rocker pivot 76 permitting the force stored in spring 78 to collapse toggle 72, 74.

Since load management module 25 is compact, operating solenoids 87, 88 are small. However, they are required to overcome the force produced by relatively stiff spring 78 and as a result solenoids 87, 88 are energized by currents which exceed allowable continuous currents for solenoids 87, 88. If the line current required to drive spring 78 over center persists beyond the time required to achieve switching, burnout of solenoids 87, 88 may result. Thus, solenoid operators 87, 88 are energized through solid state protector means 200.

The latter consists of resistor 211, S.C.R. 210 and thermistors 215, 216, all mounted on circuit board 212 having terminals 201-205 thereon. Resistor 211 is connected between terminals 201 and 203, and thermistors 215, 216 are connected from terminal 203 to the respective terminals 204, 205. The cathode-anode circuit, or power circuit, of S.C.R. 210 is connected between terminals 201 and 202, and the base electrode or gate of S.C.R. 210 is connected directly to terminal 203.

Solenoids 87, 88 are connected from terminal 202 to the respective terminals 204, 205. The two conductors of cable 98, extending through end opening 101 of housing 56, 57, connect terminals 204, 205 to the stationary terminals of single pole double throw auxiliary or selector switch 199 located externally of housing 56, 57. Switching signal line 305 is connected to the movable contact of switch 199. Terminal 201 is connected directly to conducting strap 68.

Each of the thermistors 215, 216 has a positive temperature coefficient. This type of device exhibits a switch-like increase in resistance when the temperature thereof exceeds a predetermined limit. A suitable thermistor is of the ceramic type manufactured by the Keystone Carbon Co., Inc., of St. Marys, Pa.

In operation, because of switch 199 the switching signal at line 305 is applied to only one of the solenoids 87, 88 at a given time. FIG. 5 shows the switch contacts in series with On solenoid 88 as being open. Thus, when a switching signal next appears on line 305, only Off solenoid 87 will be energized through a series path including the power circuit of S.C.R. 210. Under these circumstances the gate potential for S.C.R. 210 is derived from the voltage divider consisting of resistor 211 and thermistor 215. When thermistor 215 is relatively cool the impendance thereof is low enough so that the potential appearing at the connecting terminal 203 between resistor 211, thermistor 215 and the gate electrode of S.C.R. 210 will be above the threshold required to maintain current flow through the power circuit of S.C.R. 210, so that solenoid 87 is energized. Under normal circumstances the switching signal on line 305 will terminate before thermistor 215 reaches its critical or switching temperature, whereat the impedance thereof rises very sharply. However, should the switching signal persist beyond a permissible time interval, thermistor 215 will reach its critical temperature causing the potential at terminal 203 to drop below the gate threshold for S.C.R. 210 causing S.C.R. 210 to block current flow in the power circuit thereof, thereby deenergizing solenoid 87. The temperature resistance coefficient of the thermistor 215 is coordinated with the thermal withstand characteristic of solenoid 87 in a manner such that the temperature of thermistor 215 rises to the critical level to cut off power current flow through S.C.R. 210 before the temperature of solenoid 87 rises to a dangerous level.

It should now be apparent to those skilled in the art that when auxiliary switch 199 changes from the position shown in FIG. 5, thermistor 216 and solenoid 88 become active circuit elements in response to the next switching signal which appears on line 305.

It should also be apparent to those skilled in the art that for a construction in which switching signals for the respective solenoids 87, 88 are presented over separate lines without passing through selector switch 199, each solenoid operator may be energized through an individual protector circuit, such as the circuit of FIG. 6. Briefly, the protector circuit of FIG. 6 includes S.C.R. 301 whose power circuit is connected in series with solenoid operator 300 between terminals 302 and 303. Normally closed auxiliary switch 304 associated with solenoid 300 is connected between terminal 303 and the switching signal line 305. Resistor 306 and positive temperature coefficient thermistor 307 are connected in series between terminals 302, 303 to form a voltage divider. The potential appearing at the junction 308 between resistor 306 and thermistor 307 is applied to the gate of S.C.R. 301. With auxiliary switch 304 closed and a switching signal applied at line 305, so long as the temperature of thermistor 307 is below its critical or switching temperature the gate potential for S.C.R. 301 permits current flow in the power circuit of S.C.R. 301 thereby energizing solenoid 300. Should auxiliary switch 304 malfunction and the temperature of thermistor 307 rise above its critical level the gate threshold of S.C.R. 301 will drop to the point where S.C.R. 301 is in a blocking state and solenoid 300 will be deenergized prior to sustaining thermal damage.

The protector circuit hereinbefore described provides single phase half-wave D.C. operation. If full wave operation is desired, the circuit may be preceded by a full-wave bridge. If A.C. operation is desired, a Triac may be used in place of the S.C.R. A series resistor may be inserted to limit gate drive current.

Although a preferred embodiment of this invention has been described, many variations and modifications will now be apparent to those skilled in the art, and it is therefore preferred that the instant invention be limited not by the specific disclosure herein, but only by the appending claims.

What is claimed is:

1. Switching apparatus including an interrupter section comprising main contact means for series connection in a load circuit, a spring powered mechanism connected to said main contact means, electrically powered operator means connected to said mechanism for selectively operating the latter to open and close said main contact means, and protector means to prevent burnout of said operator means; said protector means including a solid state unit having power electrode means connected in series with said operator means in an energizing circuit for said operator means, and control electrode means to regulate current flow in said energizing circuit; said protector means also including a control circuit in series with a portion of said energizing circuit and controlling the potential at said electrode means; said control circuit including impedance means for controlling the potential applied to said control electrode means; said impedance having a relatively sharp temperature impedance characteristic coordinated with the energy withstand characteristic of the operator means whereby current flowing in said energizing circuit will raise said element to a switching temperature before said operator means is damaged by overheating; at said switching temperature said impedance means having an impedance level such that the potential applied by said control circuit to said control electrode means drives said solid state unit into a blocking state thereby interrupting said energizing circuit to deenergize said operator means.

2. Switching apparatus as set forth in claim 1 in which the impedance means is a thermistor.

3. Switching apparatus as set forth in claim 2 in which the thermistor has a positive temperature coefficient.

4. Switching apparatus as set forth in claim 3 in which at said switching temperature the impedance of said thermistor rises more rapidly than at temperatures below said switching temperature.

5. Switching apparatus as set forth in claim 1 in which the solid state unit comprises an S.C.R.

6. Switching apparatus as set forth in claim 5 in which the impedance means is a thermistor.

7. Switching apparatus as set forth in claim 6 in which the thermistor has a positive temperature coefficient.

8. Switching apparatus as set forth in claim 7 in which at said switching temperature the impedance of said thermistor rises more rapidly than at temperatures below said switching temperature.

9. Switching apparatus as set forth in claim 1 also including a manually operable switching section connected in series in said energizing circuit.

10. Switching apparatus as set forth in claim 9 in which the interrupter section is provided with a first relatively narrow housing and the switching section is provided with a second housing essentially the same width as said first housing; said housings being in adjacent side-by-side relationship.

11. Switching apparatus as set forth in claim 1 also including auxiliary switch means in series in said energizing circuit and in series with said control circuit.

12. Switching apparatus as set forth in claim 11 in which said auxiliary switch means is disposed externally of said interrupter section.

* * * * *